United States Patent [19]
Rudder et al.

[11] Patent Number: 5,643,639
[45] Date of Patent: Jul. 1, 1997

[54] PLASMA TREATMENT METHOD FOR TREATMENT OF A LARGE-AREA WORK SURFACE APPARATUS AND METHODS

[75] Inventors: Ronald Alan Rudder, Wake Forest; Robert Carlisle Hendry, Hillsborough; George Carlton Hudson, Clayton, all of N.C.

[73] Assignee: Research Triangle Institute, Research Triangle Park, N.C.

[21] Appl. No.: 361,667

[22] Filed: Dec. 22, 1994

[51] Int. Cl.$^6$ .................. H05H 1/24; B01J 3/06; H01L 21/306
[52] U.S. Cl. .................. 427/577; 427/569; 427/571; 427/534; 216/68; 216/70; 216/71; 423/446
[58] Field of Search .................. 427/571, 575, 427/577, 534, 569; 216/67, 68, 69, 70, 71; 423/446; 118/723 I, 724

[56] References Cited

U.S. PATENT DOCUMENTS

| | | | |
|---|---|---|---|
| 3,677,799 | 7/1972 | Hou | 427/580 |
| 3,843,392 | 10/1974 | Sterling et al. | 427/571 |
| 4,145,456 | 3/1979 | Küppers et al. | 427/575 |
| 4,212,933 | 7/1980 | Markin et al. | 427/577 |

(List continued on next page.)

FOREIGN PATENT DOCUMENTS 6424093  1/1989  Japan.

OTHER PUBLICATIONS

Johnson, "Comparison of Electrostatic Shielded . . . ", Prototech Research Inc. Presented Apr. 25–30, 1993 to Society of Vacuum Coaters, 36th Tech. Conf.
"Plasma Melting Systems", Retech, Inc. no date, no author.
"Plasma Etch Sources", Kurt J. Kesker Company, p. 17–4 no date no author.
Rudder, "Development of Large Area rf Induction . . . ", RTI/5676/93–Quarterly Oct. 1993, pp. 1–11.
Rudder, "Development of large–Area rf Induction . . . ", RTI Proposal No. P833–036, May 1993, pp. 1–84.
Rudder, "Development of Large Area rf Induction . . . ", RTI/5676/93–Quarterly Dec. 1993, Second Quarterly Report, pp. 1–4.
Eckert, "The INduction Arc: A State–of–the–Art Review", High Temperature Science 6, 99–134 (1974) p. 99 and attachments excerpt from no month.
Barnes et al, "Electron energy distribution function measurements . . . ", Appl. Phys. Lett. 62 (21), 24 May 1993, pp. 2622–2624.
Hopwood et al, "Electromagnetic fields in a radio–frequency . . . ", J. Vac. Sci. Technol. A 11(1), Jan./Feb. 1993, pp. 147–151.

Primary Examiner—Marianne Padgett
Attorney, Agent, or Firm—Oblon, Spivak, McClelland, Maier & Neustadt, P.C.

[57] ABSTRACT

A method and apparatus for generating plasmas adapted for chemical vapor deposition, etching and other operations, and in particular to the deposition of large-area diamond films, wherein a chamber defined by sidewalls surrounding a longitudinal axis is encircled by an axially-extending array of current-carrying conductors that are substantially transverse to the longitudinal axis of the chamber, and a gaseous material is provided in the chamber. A high-frequency current is produced in the conductors to magnetically induce ionization of the gaseous material in the chamber and form a plasma sheath that surrounds and extends along the longitudinal axis and conforms to the sidewalls of the chamber. A work surface extending in the direction of the longitudinal axis of the chamber is positioned adjacent a sidewall, exposed to the plasma sheath and treated by the plasma. Preferably, the ratio of the width to the height of the chamber is 10:1 or larger so that the chamber includes a large area planar surface adjacent the plasma sheath and adjacent to which a large area substrate or a plurality of substrates is arranged, whereby large area treatment, such as diamond deposition, can be performed.

35 Claims, 4 Drawing Sheets

U.S. PATENT DOCUMENTS

| | | | |
|---|---|---|---|
| 4,262,035 | 4/1981 | Jaeger et al. | 427/571 |
| 4,298,629 | 11/1981 | Nozaki et al. | 427/575 |
| 4,381,965 | 5/1983 | Maher, Jr. et al. | |
| 4,673,589 | 6/1987 | Standley | 427/577 |
| 4,690,793 | 9/1987 | Hitachi et al. | |
| 4,772,486 | 9/1988 | Ishihara et al. | 427/575 |
| 4,795,880 | 1/1989 | Hayes et al. | 118/723 I |
| 4,824,690 | 4/1989 | Heinecke et al. | 427/577 |
| 4,918,031 | 4/1990 | Flamm et al. | |
| 4,948,458 | 8/1990 | Ogle. | |
| 4,990,229 | 2/1991 | Campbell et al. | |
| 5,087,434 | 2/1992 | Frenklack et al. | 427/575 |
| 5,225,375 | 7/1993 | Aite et al. | |
| 5,234,529 | 8/1993 | Johnson. | |
| 5,261,962 | 11/1993 | Hamamoto et al. | |
| 5,275,798 | 1/1994 | Aida | 427/571 |
| 5,277,751 | 1/1994 | Ogle | 427/569 |
| 5,280,154 | 1/1994 | Cuomo et al. | |
| 5,346,578 | 9/1994 | Benzing et al. | 118/723 I |
| 5,431,968 | 7/1995 | Miller et al. | 427/577 |
| 5,447,756 | 9/1995 | Kamen | 427/571 |
| 5,468,296 | 11/1995 | Patrick et al. | 118/723 I |
| 5,482,748 | 1/1996 | Soderberg et al. | 423/446 |
| 5,505,780 | 4/1996 | Dalvie et al. | 118/723 I |
| 5,540,824 | 7/1996 | Yin et al. | 118/723 I |
| 5,557,722 | 9/1996 | Okumura et al. | 118/723 I |
| 5,571,366 | 11/1996 | Ishii et al. | 216/68 |

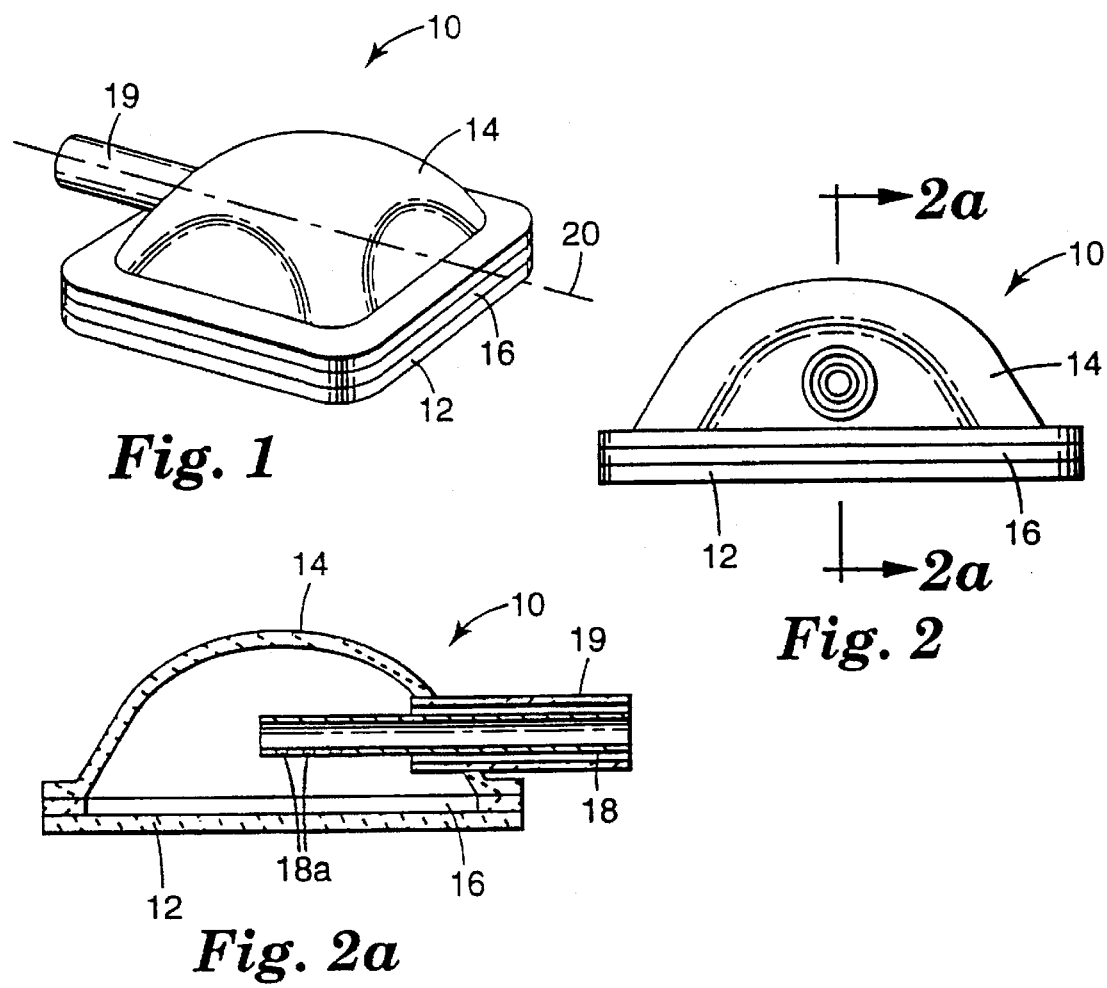
Fig. 1
Fig. 2
Fig. 2a
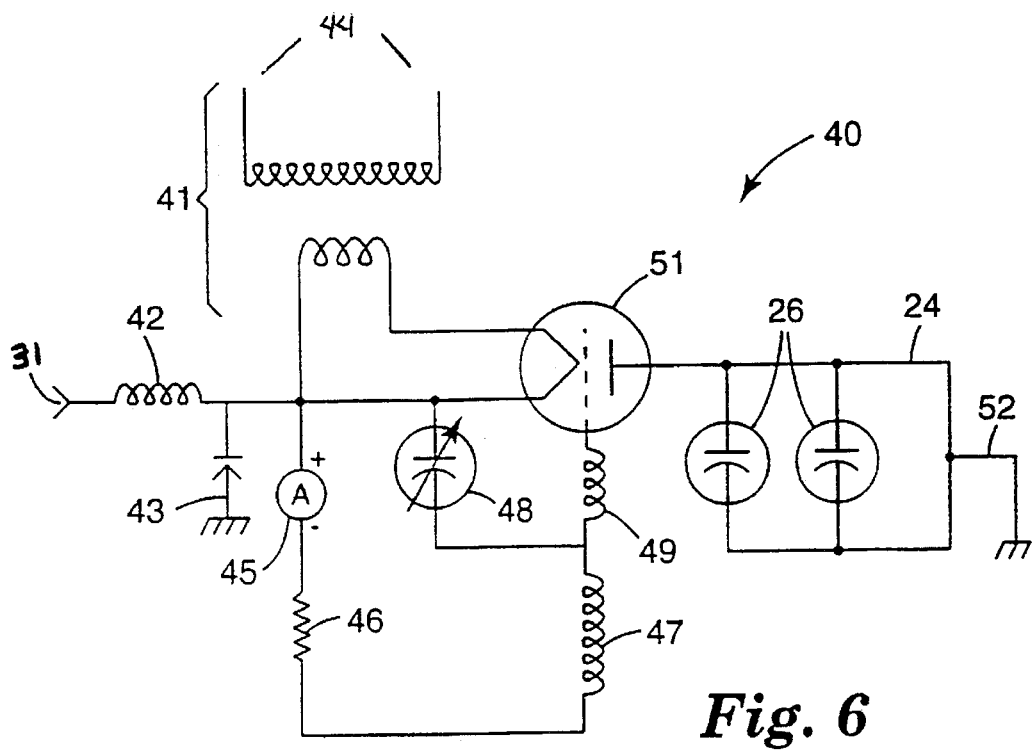
Fig. 6

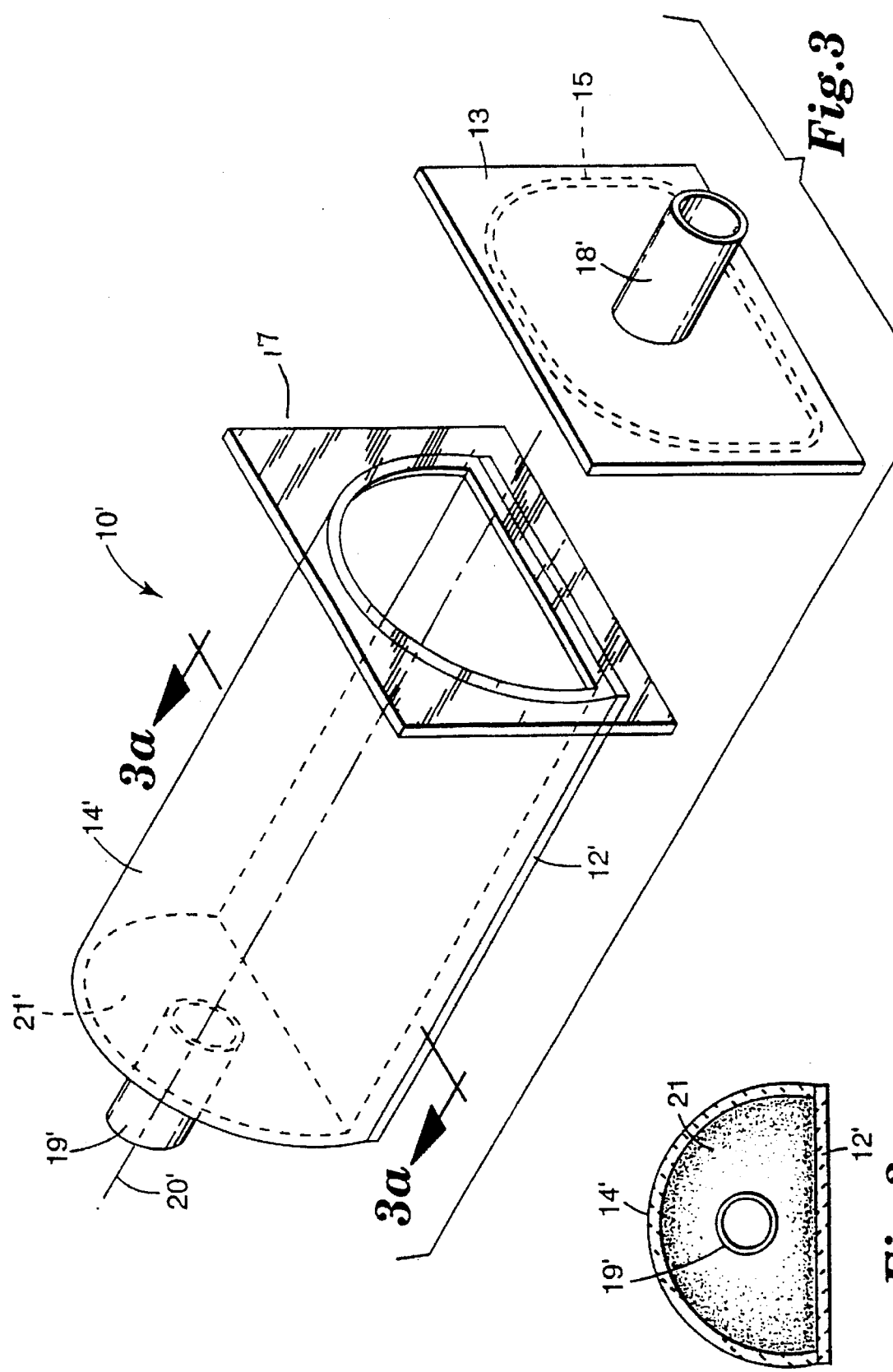

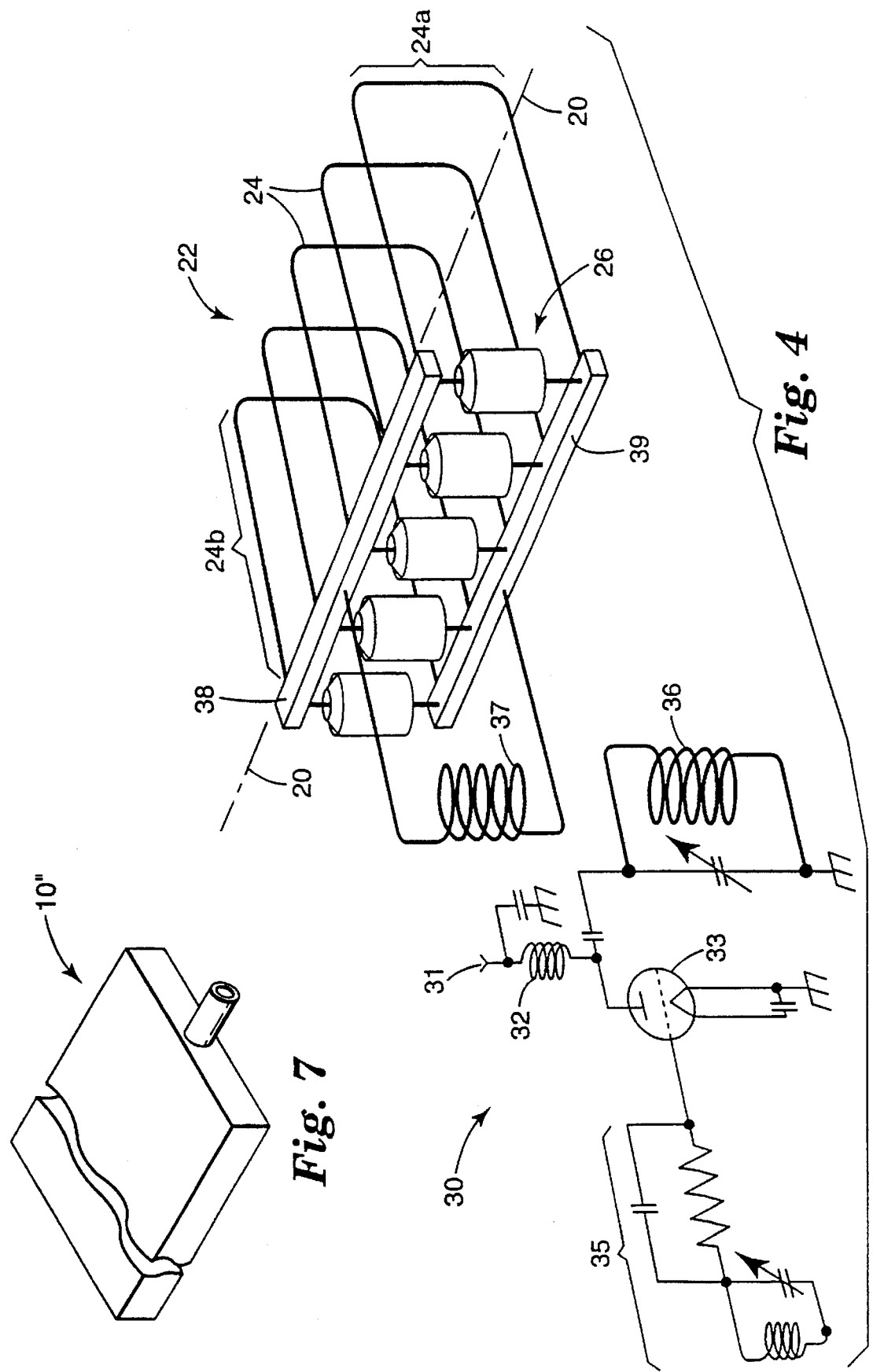

PLASMA TREATMENT METHOD FOR TREATMENT OF A LARGE-AREA WORK SURFACE APPARATUS AND METHODS

BACKGROUND OF THE INVENTION

1. Field of the Invention

The instant invention relates to apparatus and methods for generating intense plasmas adapted for chemical vapor deposition, etching and other operations. In one important embodiment, the invention relates to a vapor deposition system in which a plasma is used to deposit large-area diamond films.

2. Discussion of Background

Prior art chemical vapor deposition (CVD) processes for the production of diamond films include DC torch, microwave, hot filament and rf plasma techniques. To date, film costs have been exceedingly high. Most of the prior techniques deposit diamond films only over small areas, which slows production and limits applicability of the films; and the rates at which film is deposited are low. The combination of small deposition area and slow deposition rates causes a high cost of production for the films.

SUMMARY OF THE INVENTION

The present invention provides apparatus and methods for treating large areas at fast rates with an intense plasma. In brief summary, a method of the invention comprises a) providing a chamber having a longitudinal axis and sidewalls that surround the longitudinal axis;

b) providing an axially-extending array of current-carrying conductors that at least partially encircle the chamber and are substantially transverse to the longitudinal axis;

c) providing gaseous material in the chamber;

d) providing a high-frequency current in the conductors to magnetically induce ionization of the gaseous material in the chamber and form a plasma sheath that surrounds the longitudinal axis and conforms to sidewalls of the chamber; and e) exposing to the plasma sheath a work surface that extends in the direction of the longitudinal axis.

The chamber generally has at least one large-area planar sidewall, and the plasma sheath extends over the sidewall, parallel to the sidewall. Also, the current-carrying conductors preferably comprise conductor loops electrically connected in parallel to minimize impedance in the circuit and thereby maximize the applied current in the conductors that generate a magnetic field in the chamber. To further achieve low impedance, at least part of the individual conductor loops are generally comprised of large-diameter high-conductivity rods, which preferably are tubular to allow cooling of the conductors.

To prepare diamond film, the gaseous material introduced into the chamber comprises diamond-precursor ingredients such as a mixture of vapors of water and alcohol or hydrogen and methane. Diamond film is deposited in the reactor at volumetric production rates per unit of power input that, insofar as known to us, are higher than those reported for any other diamond-forming vapor deposition techniques; and very large-area diamond films may be deposited.

The method can be practiced on apparatus that comprises a chamber having a longitudinal axis and sidewalls that surround and extend parallel to the longitudinal axis, at least one sidewall being an extensive planar wall that is parallel to the longitudinal axis;

means for providing a gas in the chamber;

an axially extending array of current-carrying conductor loops that are substantially transverse to the longitudinal axis, at least partially encircle the chamber, and establish a magnetic field within the chamber parallel to the longitudinal axis of the chamber; and a high-frequency power supply connected to the conductor array and adapted to provide high-frequency current to the conductor loops to magnetically induce ionization of the gaseous material in the chamber.

Although the conductor loops can be electrically connected in series, as in a helical wire, preferably the conductor loops are electrically connected in parallel, and comprise at least in part cooled copper tubes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a perspective view of a chamber useful in the present invention.

FIG. 2 is an end view of the chamber of FIG. 1.

FIG. 2a is a sectional view along the lines 2a—2a in FIG. 2 in which the tube 18a is shown enlarged and not drawn to scale for purposes of illustration.

FIG. 3 is a perspective view of another embodiment of a chamber useful in the invention.

FIG. 3a is a sectional view along the lines 3a—3a in FIG. 3.

FIG. 4 is a perspective view of an axially extending array of current-carrying conductors, together with a diagram of a power supply useful in the invention.

FIG. 6 is a diagram of another power supply useful in the present invention.

FIG. 7 is a perspective diagram of another chamber useful in the invention.

DESCRIPTION OF THE PREFERRED EMBODIMENTS

Figure 5A:
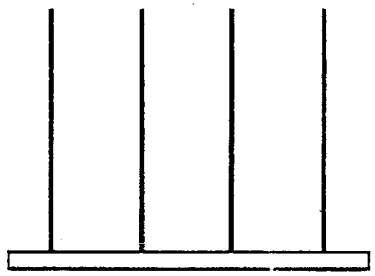
FIGS. 5(a), 5(b), 5(c), 5(d) and 5(e) depict in schematic top views various arrangements of current-carrying conductors useful in the present invention.

Referring now to the drawings, wherein like reference numerals designate identical or corresponding parts throughout the several views, and more particularly to FIGS. 1, 2 and 2a thereof, an illustrative pressure-controlled chamber 10 for use in apparatus of the present invention includes a substantially planar base plate 12 and a canopy portion 14. An O-ring 16 is typically interposed between the base plate 12 and the canopy portion 14 to effect a seal between these elements. When the chamber 10 is partially evacuated, atmospheric pressure forces the base plate 12 and the canopy portion 14 together. Tube 19 is fused to one end of the canopy portion 14 and serves as a vacuum exhaust port. A smaller-diameter inlet tube 18 is supported coaxially within the tube 19 and extends into the approximate center of the chamber 10, whereby various reactant gases are introduced to the chamber 10. In one preferred variation, as shown in FIG. 2a, circular openings 18a near the end of the inlet tube 18 allow gas to be distributed more uniformly in the chamber and thereby contribute to a more uniform treatment or deposit on a work surface in the chamber. Alternatively to the illustrated coaxial arrangement, inlet tube 18 and outlet tube 19 may be placed at opposite ends of the chamber. The longitudinal axis 20 of the chamber is parallel to the desired direction of the applied magnetic field in the chamber.

The chamber is preferably formed from dielectric material such as, for example, quartz, ceramics, plastics, composite materials, and the like. Dielectric material allows magnetic and electric field penetration into the chamber. The base plate 12 and canopy portion 14 in the construction shown in FIG. 1 preferably have a wall thickness of about 1 cm to about 5 cm, more preferably about 2 cm to about 3 cm. Base plate 12 can have any plan-view shape, for example, square, rectangular, round, oval, ellipsoidal, or irregular, adapted to mate with the canopy. Canopy 14 of chamber 10 can be any shape which provides containment of the low pressure atmosphere in chamber 10 and has structural integrity, e.g., to limit the effect of atmospheric pressure when the interior of the chamber is at low pressure and heated. Canopy 14 can be, for example, dome shaped, hemispherical, or rectangular; in the latter case, for example, it might comprise a flat panel that matches and is parallel to base plate 12, with walls extending between base plate 12 and the flat panel.

Chambers used in the invention preferably have at least one extensive substantially planar surface which serves as a work surface or supports a work surface. In the chamber 10, the base plate 12 is such a planar surface. In addition, the base plate 12 is flat, but could be configured, e.g., with a network of ridges. Such configured surfaces are regarded as planar herein, since the length and width of the surfaces is far greater than any thickness or height dimension. The larger the planar surface, the larger the area of a planar film that can be deposited or the larger the planar surface that can be treated. The planar surface is preferably at least 100 cm$^2$ in area and more preferably 500 cm$^2$ or larger, e.g., 1 or 2 m$^2$ in area or larger.

In a different embodiment of the present invention, shown in FIG. 3, base plate 12' is substantially flat, and canopy 14' is semicylindrical in form. The plate 12' and canopy 14' can be both made of quartz and be fused together. Endplate 13 further defines chamber 10' with sealing achieved by O-ring 15 against glass plate 17, which is fused to the base plate 12' and canopy 14'. A second endplate, 21', is at the other end of chamber 10'. Endplate 13 is provided with inlet port 18' while the endplate 21 is provided with an outlet port 19'.

As previously stated, a rectangular chamber can be used as generally shown in FIG. 7. A rectangular chamber is preferred for some applications, because a large-area planar film can be deposited on both the large-area sidewalls of the chamber (top and bottom walls in FIG. 7), as well as on the shorter sidewalls extending between the large-area sidewalls. "Sidewalls" refers to walls that extend in the direction of the longitudinal axis (though they may at the same time extend toward the longitudinal axis, as in the case of two of the slanted portions of the dome-shaped canopy 14 of the chamber 10 shown in FIGS. 1–2a). The sidewalls surround the longitudinal axis in that they form the lateral portions of the enclosure or chamber through which the longitudinal axis extends; typically the sidewalls are parallel to and spaced from the longitudinal axis, though as in the case of the noted two slanting portions of the canopy 14, they may intersect the longitudinal axis.

The size of a chamber useful in the invention is limited only by the mechanical integrity necessary to withstand the atmospheric pressure applied to the outside of the chamber and a need for the chamber to be substantially shorter than the characteristic wavelength at the operating frequency. At 10 MHz, the characteristic wave length is about 30 meters. The aspect ratio, i.e., the ratio of the width to the height of the chamber preferably is at least about 2:1, more preferably at least about 5:1, most preferably about 10:1 or larger.

The chamber is preferably capable of maintaining an internal pressure of less than about 100 Torr, more preferably less than about 10 Torr, most preferably about one Torr or less. Means for controlling the pressure in the chamber, not shown, can include, for example, butterfly control valves, mass flow controllers, and vacuum pumps, and a pressure measuring device, such as a capacitance manometer, all of which is well known to those skilled in the art.

An optional water jacket, not shown, may be included, having a variety of configurations as are well known to those skilled in the art of thermal management. The water jacket, when present, preferably surrounds and cools the chamber which can reach elevated temperatures at high applied power levels.

FIG. 4 shows an illustrative power applicator 22, or antenna, which generally encircles or surrounds the low-pressure chamber and applies plasma-generating power to the gaseous contents of the chamber. Within the chamber the magnetic field is more uniform and intense in comparison to the magnetic field generated by the applicator outside the chamber. The applicator comprises current-carrying conductors 24, resonated by a capacitor bank comprising capacitors 26. There may or may not be one capacitor for each conductor 24, depending on the total capacitance needed and the power level to be applied. In combination, an individual conductor 24 and the capacitor bank to which it is connected form a conductor loop, and the individual conductor loops are electrically connected in parallel through bus bars 38 and 39. The applicator 22 is shown separate from a chamber for convenience, but the chamber generally lies within the conductor loops, with the longitudinal axis of the chamber substantially perpendicular to the plane of the individual loops.

The "U"-shape for conductors 24 is desirable for enclosing chambers that are more wide than high, as useful for large-area planar depositions. The conductors are desirably of a large diameter so as to minimize impedance. To carry out the invention, current flow is induced in the plasma gas, producing heating, ionization, and dissociation of the gas. The magnitude of the current flow in the plasma gas is proportional to the current flow in the current-carrying-conductors. For any current-carrying-conductor, there is an impedance to current flow which increases with the resistance of the chosen conductor and which increases with $\omega L$, where $\omega = 2\pi f$ and f is the operating frequency and L is the inductance. To maximize current flow for any given applied voltage level requires that high conductivity materials be chosen and that the inductance of the current-carrying-conductors be kept low. Such a condition is achieved in the apparatus shown in FIG. 4 where large-diameter conductors are used, and the conductors are arranged as individual loops electrically connected in parallel and arrayed along the longitudinal axis of the chamber.

The conductors are preferably formed from high conductivity metals (e.g., silver, copper, aluminum, or brass) to reduce power loss. As a practical matter, copper or silver-plated copper is generally used, but silver-plated brass or aluminum can also be used. Tubes are desirable to allow cooling fluid to circulate within the conductors. Tubes having a diameter as low as about 0.5 to 1 cm are useful for low-power applications, and as high as about 2.5 cm (one inch) or higher for high-power applications. Solid elements such as low-resistivity metal strapping, preferably 0.5 cm to 1 cm wide, more preferably 2 to 5 cm wide, can also be used, providing proper cooling can be provided, as with fins or cooling tubes welded to the strapping.

A bus bar, not shown, may be connected across the midpoint of the length 24a of the conductors 24 and connected to ground, thereby establishing a symmetrical voltage about a ground reference, should this be desired. A ground connection may be provided to reference any part of the application to ground as well known in the art to achieve either symmetrical or asymmetrical voltages about a ground reference.

Figure 5B:
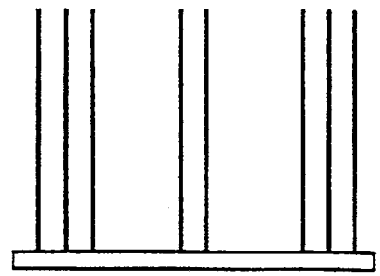
Figure 5C:
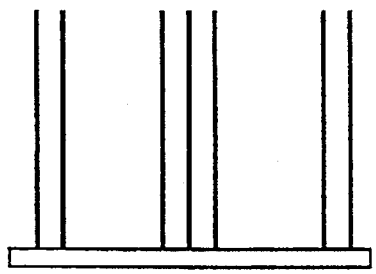
Figure 5D:
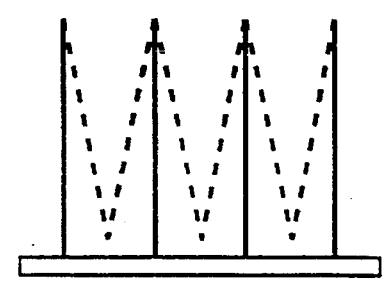
Figure 5E:
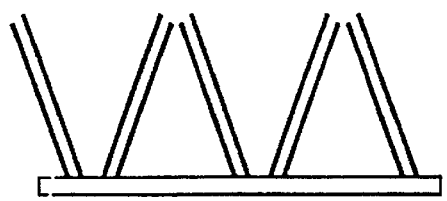
Figure 5F:
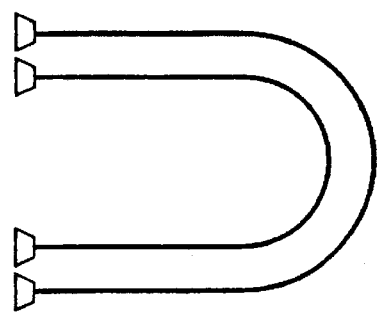
FIG. 5(f) depicts in side view another arrangement.

The conductor loops are substantially transverse to the longitudinal axis of the chamber. In FIG. 4, the planes of the conductor loops are perpendicular to the longitudinal axis and evenly spaced. In other configurations the conductors can be spaced irregularly as shown in FIG. 5(b) and (c), e.g., to achieve desired plasma configurations and intensities. Chevron configurations as shown in FIG. 5(e) or combinations of parallel and chevron configurations as shown in FIG. 5(d), can be used. Also multiple current-carrying conductors, with one conductor loop overlying or surrounding another as shown inside view in FIG. 5(f), may be used.

Series-wound coils such as helical coils, preferably wound as a rectangular or square helix, may also be used. The higher inductance of such series-wound coils may limit the current flow in current-carrying conductors and thereby restrict the maximum value of transferred power; but otherwise such coils would be useful at power levels below the maximum.

The current-carrying conductors of the power applicator may be embedded in the surface of the chamber, may lie against the surface of the chamber, or may be spaced and free-standing from the chamber. Preferably the current-carrying conductors are free-standing and spaced from the chamber to permit easy placement and removal of the chamber within the applicator. Such an arrangement permits an applicator to be conveniently used sequentially with multiple chambers. When the current-carrying conductors are spaced from the chamber, they preferably are within about 1 cm(½"), more preferably within about 0.25 cm (1/10"), from the outer chamber wall and configured to the shape of the chamber.

Although it is preferred that the conductor loops completely encircle the chamber, we have also successfully practiced the invention with conductors passing through the container, e.g., with the length 24a of the conductors 24 passing through the center of the chamber and perpendicular to the longitudinal axis of the chamber. A plasma sheath was generated within the chamber between the conductors and the sidewall of the chamber that lies within the conductor loop.

The applicator produces a high-frequency magnetic field that extends through the chamber parallel to the longitudinal axis. Charged species existing within the gaseous contents of the chamber, initiated for example by the electric field penetrating into the chamber, respond to the high-frequency magnetic field such that a current loop transverse to the longitudinal axis is induced within the gaseous material. The induced current loop forms near the boundary of the chamber and is of lesser magnitude the greater its distance from the chamber wall (as understood in the art, the induced currents are oriented so that their associated magnetic fields partially reduce the magnetic field produced by the current-carrying means, this progressively reduces the field strength the greater the distance from the chamber wall). Work done by the induced plasma current loop intensifies the ionization and dissociation of the gaseous species, producing an intense plasma sheath that conforms to the interior of the chamber wall. This plasma sheath extends laterally in the axial direction, because of the axially-extending nature of the power applicator, and because of the low pressures typically existing in the chamber. The plasma covers the sidewalls of the chamber inside of the applicator bounds. At planar chamber walls a rather planar plasma sheath parallel to the chamber wall is formed, and at curved chamber walls a plasma sheath that follows the curved surface is formed.

Once formed, the induced current loop becomes the dominant mechanism by which the applied high-frequency power is transferred to the plasma. Increased power can be applied to cause increased dissociation and ionization.

The condition in which an intense plasma is formed by the induced current loop is termed magnetically induced ionization. Typically, there is a sharp increase in luminosity of the plasma as magnetically induced ionization occurs, and there is a visible difference in luminosity from the chamber wall toward the center of the chamber.

FIG. 3a is a sectional view through the chamber 10' taken during operation of the apparatus. The dots in the drawing represent the magnetically induced plasma within the chamber (actually the plasma is observed by its visible luminosity). As seen, the plasma is more intense or dense at its outer boundary adjacent the chamber sidewalls, and gradually declines in intensity the greater its distance from the sidewall. At some distance, the intensity may decline to an extent that there is hardly any visible luminosity. Plasma intensities of $10^{12}$ electrons per cubic centimeter have been reported in the literature for magnetically induced ionizations, in contrast to electron densities of $10^{10}$ electrons per cubic centimeter reported for plasmas generated through so-called capacitive coupling; the latter occurs, for example, when an electric field penetrates into the chamber of an apparatus of the invention and acts on the neutral gaseous contents of the chamber, e.g., during plasma initiation prior to achieving magnetically induced ionization.

As shown in FIG. 3a, when gases are introduced into the chamber through a central inlet tube, they first diffuse through the relatively lower-density plasma to the higher-density plasma sheath. Such a path for the gas is considered advantageous, for example, to facilitate formation of carbon monoxide when vaporized water/alcohol mixtures are used, as shown in earlier patent application Ser. Nos. 07/787,891, filed Nov. 5, 1991; 08/861,291, filed May 14, 1993; and 08/151,184, filed Nov. 12, 1993. These patent applications, and a published PCT counterpart (WO 93/08927, published May 13, 1993) are hereby incorporated by reference.

The intense plasma has many benefits. For example, it produces rapid dissociation of diamond-precursor gaseous feedstocks so as to allow rapid deposition of diamond films. The conformance and proximity of the plasma sheath to the chamber wall, where diamond deposition occurs, is advantageous because dissociated diamond-forming species need travel only a short distance to contact the work surface. The high temperatures and high electron density produced in an intense plasma can be also used in other ways, such as to clean surfaces, etch surfaces, or to incinerate waste materials.

As previously noted, the sidewalls of the chamber can be used as a work surface, or a work surface can be supported on and generally conform to the chamber sidewalls. Thus, the work surface is preferably disposed at and conforms to the outer boundary of the plasma sheath, where the plasma sheath is most intense and active; and the generally extensive work surface, preferably planar, is acted upon by the plasma sheath at this high intensity over substantially the full extent of the work surface. Large-area films can be deposited, or large-area surfaces cleaned, etched. etc. Work surfaces can also be located at other places in the plasma sheath, though they generally extend in the direction of the longitudinal axis and preferably have a shape conforming to the contour of the plasma sheath.

The power supply to the applicator generally may be any type known to those skilled in the art. The desired power level varies with the pressure in the chamber and the ionization potential of the gas in the chamber; the type of deposition, etching, or cleaning, or other operation to be carried out; the rate of throughput desired; the temperature ranges appropriate for materials and substrates being used, etc. The needed power to induce ionization can readily be determined in many cases from reported relationships between power level, pressure, and desired gases; and simple experimentation can be used by general principles reported in the field of induction arcs for nonreported materials or to further define the needed and preferred conditions.

For diamond deposition using water-ethanol mixtures, power levels of about 7 watts or more per square centimeter have been sufficient to deposit diamond at a rate of about 1 µm/hr. Power density is calculated by dividing the power dissipated in the chamber by the area of the longitudinally extending sidewalls of the chamber (the power dissipated in the chamber can be measured, or it can be calculated with rather good accuracy by multiplying the initial applied dc power by the efficiency of the applicator, which for the illustrated applicator is generally on the order of 65 percent. While not rigorous, other diamond-forming feedstocks such as hydrogen-methane mixtures generally require power densities approximately twice as great. At gas pressures less than 0.5 Torr, magnetically induced ionization is generally achieved with power densities of two or three watts per square centimeter of chamber sidewall.

RF power supply units are commercially available for example, from Lepel Corporation (e.g., Model NO. T-40-3-DF4-TL). Schematic diagrams of other useful rf power supplies are shown in FIGS. 4 and 6. FIG. 4 shows a rf power supply 30 which provides variable coupling control. The rf power supply comprises a high voltage variable DC power source 31 connected through rf choke coil 32 to the plate of vacuum tube 33. The switching on and off converts the dc supply energy to high-frequency energy. Vacuum tube 33 is connected to grid complex-impedance circuit 35, and primary tank coil 36, which has variable tank capacitance. Primary tank coil 36 and coupling-link coil 37 comprise the matching network. The coupling-link coil 37 is connected between the bus bars 38 and 39, which are connected to the conductor loops 24 and capacitor bank 26.

FIG. 6 diagrams another rf power supply having a direct coupled circuit 40. The circuit comprises a transformer 41 from which an auxiliary 44 source supplies source energy to the oscillator filament. Inductor 42 and capacitor 43 form a decoupling circuit through which dc energy is fed at 31. Meter 45, resistor 46, rf choke inductor 47, variable capacitor 48, and inductor 49 comprise a grid circuit complex impedance. Vacuum tube 51 switches the dc supply at high frequency and pumps rf current to the capacitors 26 and current-carrying conductors 24 through bus bars such as 38 and 39 in FIG. 4. The connection 52 to ground affords a dc return path from the vacuum tube to the power supply.

The power supply provides a high frequency current to the applicator, by which is meant herein a frequency between about 60 Hz and 100 MHz, where induction-coupled plasmas have been operated using other applicators and applicator geometries. The power supply preferably operates at about 0.5 to 20 MHz, more preferably at about 7 to 15 MHz. Such frequencies are within the band commonly referred to as a radio frequency. Government regulators have allotted 13.56 MHz for industrial uses, and that is a suitable frequency for use in the invention.

Various feed stocks may be supplied to the chamber depending on the function to be performed, for example, deposition of diamond or other materials, etching, cleaning, or pyrolysis. The feedstock is generally gaseous, or vaporizes to a gaseous form upon introduction into the chamber. Suitable diamond-forming feedstock gases include a mixture of alcohol and water. Alcohols suitable for use in the invention include methanol, ethanol, and isopropanol. Ethanol is a particularly preferred alcohol. The ratio of alcohol to water is preferably in the range of about 1:1.5 to 4:1, more preferably in the range of about 1:1 to 2:1, most preferably 1:1 to 1.2:1.

For depositing films other than diamond, silane-containing feedstocks can be used with oxygen for $SiO_2$ deposition, with nitrogen for $Si_3N_4$ deposition, and with methane for SiC deposition; or proportionate mixtures can be used for various silicon alloys.

For etching or priming, i.e., removal of surface material, the gas choice is highly dependent of the surface to be etched. For silicon surfaces, molecular $H_2$ can be used as well as $CF_4/O_2$ mixtures. For polymeric surfaces, oxygen-rich gases such as $O_2$, $H_2O$, $N_2O$ or $H_2O_2$ can be used.

For cleaning of substrate surfaces to remove residual carbon, oil, or adhesive, oxygen-based feedstocks such as $O_2$, $H_2O$, $N_2O$ or $H_2O_2$ would also be suitable.

When the apparatus of the current invention is used for hazardous waste destruction, the hazardous material must present itself in vapor form or be entrained in a process gas stream. For example, destruction of trichloroethylene can be performed by entraining the liquid in a gas stream containing $O_2$ and $H_2$. The resultant gas stream would contain CO, HCl, and $H_2O$. The HCl and $H_2O$ would be condensed from the gas stream and neutralized. The CO would be burnt to $CO_2$.

The invention will be further illustrated by the following examples.

EXAMPLE 1

A polycrystalline diamond film was produced using a chamber as generally shown in FIG. 1 and an applicator generally as shown in FIG. 4. The dome portion 14 of the chamber was made of quartz with a wall thickness of ⅜ inch (approximately 1 centimeter) and an area at its base of 14 inches by 16 inches (about 35 by 40 cm); and the base plate had a thickness of 1.25 inches (about 3 centimeters).

An array of eighteen conductor loops was used, with the conductors being 1.27-cm diameter copper tubes and having a "U" shape, with 53-cm long legs (24b in FIG. 4) and a 18-cm base (24a in FIG. 4). A capacitor bank comprising eleven 250-pf, 30 kV (test voltage) capacitors, providing a total capacitance of 2750-pf, was used, and the circuit was operated to resonate at 8 MHz.

Three quartz substrate plates, one 8 inches by 10 inches (20 by 25 cm) in area and two 4 inches by 4 inches (10 by 10 cm) in area, were laid on the base plate of the apparatus to cover an area 8 inches×14 inches (20 by 35 cm). The substrate plates had been sandblasted and subsequently rescratched using a paste containing diamond particles averaging one micrometer in diameter. The chamber was evacuated, and a mixture of water vapor and ethanol vapor introduced into the chamber through the tube 18. The water vapor was introduced at a flow rate of 19 sccm and the ethanol vapor at a flow rate of 15 sccm. Pressure in the chamber was set at 0.4 Torr. The plasma power supply was activated and a plasma initiated, whereupon the pressure in the chamber was increased to 0.5 Torr. A dc voltage of 6.4 kV was applied to the plate of the power tube 33, resulting in a plate current of 1.5 A at a frequency of 8.5 MHz. The plasma power density was calculated as about 3 watts per square centimeter of internal sidewall surface area of the chamber. The system was operated steadily for 47 hours at which time the power was discontinued, the system vented, and the samples removed from the chamber. Visual inspection of the plates showed that diamond film had been deposited over essentially the whole 8"×14" area. Some gradations in the thickness of the deposited film, visible as different shades, were detected; but large portions of the deposit were of a rather uniform thickness. The samples were subjected to Raman spectroscopy and a pronounced peak at 1332 cm$^{-1}$ was detected. SEM photographs through a cross section of the sample revealed a thickness of about 30 microns over substantial portions of the deposit, and microscopic examination of the top surface of the film revealed faceting of the film.

EXAMPLE 2

A polycrystalline diamond film was produced using apparatus as shown in FIG. 3 (except that the inlet tube 18' was coaxial with and within tube 19' as illustrated for chamber 10 in FIG. 1) and an applicator generally as shown in FIG. 4. The chamber comprised a flat base plate 12' of quartz that was 0.375 inch (1 cm) thick and approximately 10 inches (25 cm) long and 5 inches (12.5 cm) wide. The dome portion 14' was cut from a cylinder having a diameter of approximately 6 inches (15 cm), cut along a 5-inch (12.5-cm) chord of the cylinder. The wall thickness was about 0.125 inch (0.32 cm).

An array of eighteen conductor loops was used, with the conductors being 1.27-cm diameter copper tubes and having a "U" shape, with 53-cm long legs (24b in FIG. 4) and a 18-cm base (24a in FIG. 4). A capacitor bank comprising eleven 250-pF, 20 kV capacitors, providing a total capacitance of 2750 pF was used, and the circuit was operated to resonate at 8.5 MHz.

Two silicon wafers, approximately five inches (10 cm) in diameter, were inserted into the chamber and laid on the base plate. The chamber was evacuated and a mixture of water vapor and ethanol vapor introduced using a flow rate of 8 sccm for the water vapor and 12 sccm for the ethanol vapor. The power supply was activated and a plasma initiated, and pressure inside the chamber established at 0.7 Torr. The dc voltage to the plate of the power tube was set at 7.3 kV producing a plate current of 1.8 A at a frequency of 8.5 MHz. These conditions were maintained for 120 hours. Thereupon, the voltage supply was discontinued, the system vented, and the silicon wafers removed from the chamber. Diamond film had deposited on the silicon wafers, and also on the inside surface of the dome area of the chamber.

The material on the inside dome surface was released from an area about 8 inches by 8 inches (20 cm by 20 cm). SEM showed this material to be well faceted at a thickness of about 70 µm. Raman spectroscopy showed a well-defined 1332 cm$^{-1}$ peak on a strong luminescent background. Material taken from the silicon wafers showed a better Raman spectrum with a sharper peak and very little background luminescence. Interestingly, the diamond on the silicon wafer was substantially thicker, probably due to the higher substrate temperature resulting from the silicon wafer resting on the flat plate section o which was thicker than the dome.

EXAMPLE 3

Apparatus similar to that as described in Example 2 was used to etch a silicon wafer, except that fewer conductor loops were used and the total capacitance was 1000–1500 pF. The wafer was placed on the base plate of the chamber and the chamber pumped down to less than 0.050 Torr. Hydrogen was introduced into the chamber through a mass flow controller at a rate of 40 sccm, after which the power supply was activated and the plasma initiated. The pressure was established at 0.124 Torr, and the dc voltage to the plate of the power tube was set at 3.2 kV, producing a plate current of 0.8 amps at a frequency of 13.56 MHz. An optical emission spectrum was taken during the plasma treatment through the quartz dome. The emission spectrum showed peaks for atomic hydrogen at 656 and 486 nanometers, and in addition, showed a sizable emission at 414 nanometers, which indicates the presence of SiH generated during the etching process. Treatment was continued for 3 hours and 40 minutes, whereupon the voltage was discontinued, the system vented, and the silicon wafer removed from the chamber. A visible change had occurred in the finish of the wafer. Examination by SEM micrographs showed that the silicon surface had been pronouncedly etched by the hydrogen plasma exposure.

EXAMPLE 4

Apparatus as described in Example 3 was used to clean a 5-inch diameter silicon wafer which had been sprayed with 3M "Super 77" Spray Adhesive and allowed to dry. The thickness of the layer was about 500 µm. The wafer was cut in two and one-half placed into the chamber resting on the base plate. The chamber was evacuated to 0.005 Torr and water vapor introduced into the chamber through a needle valve until the pressure read 0.050 Torr. The power supply was activated and a plasma initiated. DC voltage of 3 kV was supplied to the plate of the vacuum tube, producing a plate current of 0.75 amps. Initially, for about two minutes, the system pressure spiked as adhesive was being dissolved. The pressure spike caused the plasma to extinguish and then restart when the pressure returned to the initial low pressure level. The system pressure stabilized in about two minutes at a pressure of 0.045 Torr; the plate voltage was 2.5 kV, and the plate current, 0.75 amps. The system was then run for about five minutes, whereupon the voltage supply was discontinued, the system vented, and the wafer removed from the chamber. After inspection it could be seen that cleaning was not complete; only the central section of the wafer had been cleaned. Treatment was then resumed with water introduced to give a pressure of 0.070 Torr prior to plasma initiation and a pressure of 0.119 Torr after plasma initiation. The plate voltage was 3 kV and current on the plate was 1 amp. Treatment was continued for 15 minutes whereupon the glue appeared to have been dissolved, but a residue was still apparent on the wafer. The sample was reloaded and treatment repeated for 15 minutes, with a pressure of 0.130 Torr, plate voltage of 3.5 kV and current of 0.8 amps. After 15 minutes the treatment was discontinued and the sample removed and inspected. Some residue present as a fine powder was present but was easily removed by wiping the surface of the wafer with a wet cloth.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for treating at least one work surface of at least one substrate with a plasma, comprising:
   a) providing a chamber having a longitudinal axis and sidewalls that surround the longitudinal axis;
   b) providing an array of current-carrying conductors that are arranged along said longitudinal axis of said chamber, at least partially encircle the chamber, and are substantially transverse to the longitudinal axis of the chamber;
   c) providing a gaseous material in the chamber;
   d) providing high-frequency current in the conductors to magnetically induce ionization of the gaseous material in the chamber and form a plasma sheath that surrounds and extends along the longitudinal axis and conforms to the sidewalls of the chamber; and
   e) positioning the at least one work surface adjacent at least one sidewall of said chamber at a boundary between the plasma sheath and the at least one sidewall, with the at least one work surface having a shape which is conformal to a shape of the at least one sidewall, so as to expose said at least one work surface to the plasma sheath at said boundary.

2. A method of claim 1, in which the current-carrying conductors comprise loops electrically connected in parallel.

3. A method of claim 1, in which the at least one sidewall of the chamber is planar, and the plasma sheath extends as a planar sheath parallel to the planar sidewall.

4. A method of claim 3, in which the planar sidewall is at least 100 cm$^2$ in area and the plasma sheath extends over the planar sidewall.

5. A method of claim 3, in which the planar sidewall is at least one square meter in area.

6. A method of claim 1, in which the gaseous material form elements in the plasma sheath that etch the work surface.

7. A method of claim 1, in which the gaseous material form elements in the plasma sheath that clean the work surface of material coated on the work surface.

8. A method for treating at least one work surface of at least one substrate with a plasma, comprising:
   a) providing a chamber having a longitudinal axis and sidewalls that surround the longitudinal axis and extend parallel to the longitudinal axis, at least one sidewall being planar;
   b) providing an array of current-carrying conductor loops that are arranged along said longitudinal axis of said chamber, encircle the chamber, are substantially transverse to the longitudinal axis, and are electrically connected in parallel;
   c) providing a gaseous material in the chamber;
   d) providing high-frequency current in the conductor loops to magnetically induce ionization of the gaseous material in the chamber and form a plasma sheath that surrounds and extends along the longitudinal axis and conforms to the sidewalls of the chamber, a portion of the plasma sheath extending as a planar sheath parallel to the planar sidewall; and
   e) positioning the at least one work surface adjacent the planar sidewall at a boundary between the plasma sheath and the planar sidewall, with the at least one work surface being planar to conform in shape to the planar work surface at said boundary, so as to expose said at least one work surface to said plasma sheath at said boundary.

9. A method of claim 8, in which the planar sidewall is at least 100 cm$^2$ in area and the planar sheath extends over the planar sidewall.

10. A method of claim 8, in which the planar sidewall is at least one meter square in area and the planar plasma sheath extends over the planar sidewall.

11. A method of claim 8, in which the gaseous material forms elements in the plasma sheath that etch the work surface.

12. A method for forming diamond film on a work surface adapted for diamond film deposition, comprising:
   a) providing a chamber having a longitudinal axis and sidewalls that surround the longitudinal axis;
   b) providing an array of current-carrying conductors that are arranged along said longitudinal axis of said chamber, encircle the chamber, and are substantially transverse to the longitudinal axis of the chamber;
   c) providing a gaseous diamond-precursor feedstock in the chamber;
   d) providing high-frequency current in the conductors to magnetically induce ionization of the gaseous material in the chamber and form a plasma sheath that surrounds and extends along the longitudinal axis and conforms to the sidewalls of the chamber; and
   e) positioning the work surface adjacent at least one sidewall of said chamber at a boundary between said at least one sidewall and said plasma sheath, with said at least one work surface having a shape which is conformal to a shape of said at least one sidewall, so as to expose said at least one work surfaces to the plasma sheath at said boundary and form said diamond film on said work surface.

13. A method of claim 12, in which the current-carrying conductors are electrically connected in parallel.

14. A method of claim 12, in which at least one sidewall of the chamber is planar, and the plasma sheath extends as a planar plasma sheath parallel to the planar sidewall of said chamber.

15. A method of claim 14, in which the work surface is planar and is parallel to and exposed to the planar plasma sheath.

16. A method of claim 15, in which the planar work surface is at least 100 cm$^2$ in area and the plasma sheath extends over the planar work surface.

17. A method of claim 15, in which the planar work surface is at least one square meter in area and the planar sheath extends over the planar work surface.

18. A method for forming diamond film on at least one planar work surface of at least one substrate, comprising:
   a) providing a chamber having a longitudinal axis and sidewalls that surround the longitudinal axis and extend parallel to the longitudinal axis, at least one sidewall being planar;
   b) providing an array of current-carrying conductor loops are arranged along said longitudinal axis of said chamber, that individually encircle the chamber, are substantially transverse to the longitudinal axis, and are electrically connected in parallel;

c) providing a gaseous diamond precursor material in the chamber;

d) providing high-frequency current in the conductor loops to magnetically induce ionization of the gaseous material in the chamber and form a plasma sheath that surrounds and extends along the longitudinal axis and conforms to the sidewalls of the chamber, a portion of the plasma sheath extending as a planar sheath parallel to the planar sidewall; and e) positioning the at least one planar work surface adjacent the planar sidewall at a boundary between the plasma sheath and the planar sidewall, so as to expose said at least one planar work surface to said planar plasma sheath at said boundary.

19. A method of claim 18, in which the planar sidewall is at least 100 cm$^2$ in area, and said work surface is exposed to said planar portion of said plasma sheath.

20. A method of claim 18, in which the planar sidewall is at least one meter square in area, and said work surface is exposed to said planar portion of said plasma sheath at an outer boundary of the planar portion of the plasma sheath.

21. A method for treating at least one work surface with a plasma, comprising:

a) providing a chamber having a longitudinal axis and sidewalls that surround the longitudinal axis;

b) providing a gaseous material in the chamber;

c) generating within said chamber a magnetically induced plasma sheath that surrounds and extends along the longitudinal axis and conforms to the sidewalls of the chamber; and d) positioning the at least one work surface adjacent at least one sidewall of said chamber at a boundary between the plasma sheath and the at least one sidewall, with the at least one work surface having a shape which is conformal to a shape of the at least one sidewall, so as to expose said at least one work surface to the plasma sheath at said boundary.

22. The method of claim 21, wherein step d) of positioning the work surface includes exposing the work surface to the outer boundary of the plasma sheath.

23. The method of claim 21, wherein said step c) of generating a plasma sheath comprises:

generating high-frequency electric current in a loop that at least partially encircles the chamber and is substantially transverse to the longitudinal axis of the chamber, the high-frequency current generating a magnetic field within the chamber in a direction parallel to the longitudinal axis and with a magnitude sufficiently great to magnetically induce ionization of the gaseous material in the chamber.

24. The method of claim 23, wherein the high-frequency current is generated in an array of current-carrying conductors that at least partially encircle the chamber and are arranged along said longitudinal axis.

25. The method of claim 23, wherein the array comprises individual conductors encircling the chamber and electrically connected in parallel.

26. The method of claim 21, wherein said step d) comprises:

etching the at least one work surface.

27. The method of claim 21, wherein said step d) comprises:

cleaning the at least one work surface.

28. The method of claim 21, wherein:

said step b) comprises providing a gaseous diamond-precursor feedstock in the chamber; and said step d) comprises depositing a diamond film on said at least one work surface.

29. The method of claim 21, wherein at least one said work surface comprises a planar surface that is at least 100 cm$^2$ in area.

30. The method of claim 22, wherein at least one said work surface comprises a planar surface that is at least 100 cm$^2$ in area.

31. The method of claim 26, wherein at least one said work surface comprises a planar surface that is at least 100 cm$^2$ in area.

32. The method of claim 27, wherein at least one said work surface comprises a planar surface that is at least 100 cm$^2$ in area.

33. The method of claim 28, wherein at least one said work surface comprises a planar surface that is at least 100 cm$^2$ in area.

34. The method of claim 21, in which the chamber comprises at least two parallel planar sidewalls.

35. A method for treating a work surface with a plasma, comprising:

a) providing a chamber having a longitudinal axis and sidewalls that surround the longitudinal axis, said chamber dimensioned such that when the longitudinal axis is aligned with a time varying magnetic field, the chamber and field will support a plasma sheath;

b) providing a gaseous material in the chamber;

c) generating within said chamber the time varying magnetic field to induce magnetically the plasma sheath, said plasma sheath surrounding and extending along the longitudinal axis and conforming to the sidewalls of the chamber, said magnetic field having a radial intensity distribution such that magnetic flux linked by said plasma sheath is sufficient to induce a circumferential electric field in the plasma sheath sufficient to sustain a plasma of an energy density requisite to perform predetermined plasma treatment; and d) positioning the work surface substantially parallel to the time-varying magnetic field and adjacent at least one of said sidewalls at a boundary between said plasma sheath and said at least one of said sidewalls, within said work surface having a shape conformal to a shape of said at least one sidewall, to expose said work surface to said plasma sheath at said boundary and thereby to perform the predetermined plasma treatment.

\* \* \* \* \*

UNITED STATES PATENT AND TRADEMARK OFFICE
CERTIFICATE OF CORRECTION

PATENT NO. : 5,643,639
DATED : July 1, 1997
INVENTOR(S) : Ronald Rudder et al.

It is certified that error appears in the above-identified patent and that said Letters Patent is hereby corrected as shown below:

Column 1,
Line 4, after the title, insert the following:
-- This invention was made with Government support and under Contract N00014-94-C-0030 awarded by the Office of Naval research. The Government has certain rights in the invention. --

Signed and Sealed this

Sixth Day of July, 2004

JON W. DUDAS
*Acting Director of the United States Patent and Trademark Office*